United States Patent [19]
Aoshima et al.

[11] Patent Number: 4,841,234
[45] Date of Patent: Jun. 20, 1989

[54] VOLTAGE DETECTOR UTILIZING AN OPTICAL PROBE OF ELECTRO-OPTIC MATERIAL

[75] Inventors: Shinichiro Aoshima; Yutaka Tsuchiya, both of Shizuoka, Japan

[73] Assignee: Hamamatsu Photonics Kabushiki Kaisha, Shizuoka, Japan

[21] Appl. No.: 200,563

[22] Filed: May 31, 1988

[30] Foreign Application Priority Data

May 31, 1987 [JP] Japan ............... 62-137056

[51] Int. Cl.$^4$ ............... G01R 19/00; G01R 31/00; G02F 1/09
[52] U.S. Cl. ............... 324/96; 350/356; 350/376
[58] Field of Search ............... 324/96, 77 K; 350/374, 350/375, 376, 377, 378, 387, 388, 356; 332/7.51; 455/616; 370/2

[56] References Cited

U.S. PATENT DOCUMENTS

| 4,446,425 | 5/1984 | Valdmanis et al. | 324/77 K |
| 4,603,293 | 7/1986 | Mourou et al. | 324/96 |
| 4,618,819 | 10/1986 | Mourou et al. | 324/77 K |

FOREIGN PATENT DOCUMENTS 0197196 10/1986 European Pat. Off. .
58-0146858 9/1983 Japan ............... 324/96

OTHER PUBLICATIONS

Valdmanis, J. A. et al., "Subpicosecond Electrooptic Sampling: Principles and Applications", IEEE Journal of Quantum Electronics, vol. qe-22, No. 1, pp. 69–78, Jan. 1986.
Valdmanis, J. A. et al., "Picosecond Electrooptic Sampling System", Appl. Phys. Lett., vol. 41, No. 3, pp. 211–212, Aug. 1982.
Valdmanis, J. A. et al., "Subpicosecond Electrical Sampling", IEEE Journal of Quantum Electronics, vol. qe-19, No. 4, pp. 664–667, Apr. 1983.
Kolner, B. H. et al., "Electro-Optic Sampling With Picosecond Resolution", Electronics Letters, vol. 19, No. 15, pp. 574–575, Jul. 1983.
Tsuchiya, Y., "Advances in Streak Camera Instrumentation for the Study of Biological and Physical Processes", IEEE Journal of Quantum Electronics, vol. qe-20, No. 12, pp. 1516–1528, Dec. 1984.
Valdmanis, J. A., "High-Speed Optical Electronics: The Picosecond Optical Oscilloscope", Solid State Technology/Test and Measurement World, pp. S40–S44, Nov. 1986.
Valdmanis, J. A. et al., "Electro-Optic Sampling: Testing Picosecond Electronics Part 1. Principles and Embodiments", Laser Focus/Electro-Optics, pp. 84–96, Feb. 1986.
Valdmanis, J. A. et al., "Electro-Optic Sampling: Testing Picosecond Electronics Part 2. Applications", Laser Focus/Electro-Optics, pp. 96–106, Mar. 1986.
Valdmanis, J. A. et al., "Subpicosecond Electrical Sampling and Applications", Picosecond Optoelectronic Devices, pp. 249–270, 1984.
Williamson, S. et al., "Picosecond Electro-Electron Optic Oscilloscope", Proc. Conf. Picosecond Electron. Optoelectron., pp. 58–61, (New York, Springer-Verlag), 1985.
Kolner, B. H. et al., "Electrooptic Sampling in GaAs Ingergrated Circuits", IEEE Journal of Quantum Electronics, vol. qe-22, pp. 79–93, Jan. 1987.
Nees, J. et al., "Noncontact Electro-Optic Sampling with a GaAs Injection Laser", Electronics Letters, vol. 22, No. 17, pp. 918–919, Aug. 1986.

Primary Examiner—Ernest F. Karlsen
Attorney, Agent, or Firm—Finnegan, Henderson, Farabow, Garrett, & Dunner

[57] ABSTRACT

A voltage detector detects a voltage developing in a selected area of an object such as an integrated circuit by utilizing an electro-optic material equipped in an optical probe. A change in refractive index of the electro-optic material which is caused by the voltage in the object, is detected as a change of polarization of a light beam passing through the electro-optic material. In order to improve the detection sensitivity the voltage detector is equipped with an optical means for making light paths of an input light and an output light different from each other.

12 Claims, 4 Drawing Sheets

VOLTAGE DETECTOR UTILIZING AN OPTICAL PROBE OF ELECTRO-OPTIC MATERIAL

BACKGROUND OF THE INVENTION

The present invention relates to a voltage detector for detecting the voltage developing in a selected area of an object to be measured such as an electric circuit. In particular, the present invention relates to a voltage detector of the type that detects voltage by making use of the change in light polarization that occurs in accordance with the voltage developing in a selected area of an object to be measured.

Various voltage detectors have been used to detect the voltage developing in a selected area of objects to be measured such as electric circuits. Conventional voltage detectors are roughly divided into two types: in one type, the probe is brought into contact with a selected area of an object to be measured and the voltage developing in that area is detected; and in the other type, the probe does not make contact with a selected area of an object to be measured and instead an electron beam is launched into that area and the voltage developing in it is detected.

Voltage changes rapidly in fine-line portions of objects such as integrated circuits that are small and complicated in structure, and a strong need exists in the art for detecting such rapidly changing voltage with high precision without affecting the fine-line portions. However, this need has not been fully met by the prior art voltage detectors. With devices of the type that detects voltage by bringing the probe into contact with a selected area of an object to be measured, it is difficult to attain direct contact between the probe and a fine-line portion of the object of interest such as an integrated circuit. Even if this is successfully done, it has been difficult to correctly analyze the operation of the integrated circuit solely on the basis of the voltage information picked up by the probe. A further problem involved is that contact by the probe can cause a change in the operation of the integrated circuit. Voltage detectors of the type that employs an electron beam has the advantage that they are capable of voltage detection without bringing the probe into contact with an object to be measured. However, the area to be measured with such voltage detectors has to be placed in vacuum and its surface must be exposed at that. In addition, the area to be measured is prone to be damaged by electron beams.

The prior art voltage detectors have a common problem in that they are unable to operate quickly enough to follow rapid changes in voltage and hence fail to achieve precise detection of voltages that change rapidly as in integrated circuits.

With a view to solving these problems, it has been proposed by the present inventors (Japanese patent application No. 137317/1987 filed on May 30, 1987) that voltage be detected by making use of the polarization of a light beam that changes with the voltage developing in a selected area of an object to be measured.

A voltage detector operating on this principle is schematically shown in FIG. 8. The detector generally indicated by 50 is composed of the following components: an optical probe 52; a CW (Continuous-Wave) light source 53 typically in the form of a laser diode; an optical fiber 51 for guiding a light beam from the CW light source 53 into an optical probe 52 via a condenser lens 60; an optical fiber 92 for guiding reference light from the optical probe 52 into a photoelectric converter 55 via a collimator 90; an optical fiber 93 for guiding output light from the optical probe 52 into a photoelectric converter 58 via a collimator 91; and a comparator circuit 61 for comparing the electric signals form the photoelectric converters 55 and 58.

The optical probe 52 is filled with an electro-optic material 62 such as an optically uniaxial crystal of lithium tantalate (LiTaO$_3$) The tip 63 of the electro-optic material 62 is worked into a frustoconical shape. The optical probe 52 is surrounded with a conductive electrode 64 and has at its tip 63 a coating of reflecting mirror 65 in the form of a thin metal film or a multilayered dielectric film.

The optical probe 52 further includes the following components: a collimator 94; condenser lenses 95 and 96; a polarizer 54 for selectively extracting a light beam having a predetermined polarized component from the light beam passing through the collimator 94; and a beam splitter 56 that splits the extracted light beam from the polarizer 54 into reference light and input light to be launched into the electro-optic material 62 and which allows the output light emerging from the electro-optic material 62 to be directed into an analyzer 57. The reference light is passed through the condenser lens 95 and thence launched into the optical fiber 92, whereas the output light emerging from the electro-optic material 62 is passed through the condenser lens 96 and thence launched into the optical fiber 93.

Voltage detection with the system shown in FIG. 8 starts with connecting the conductive electrode 64 on the circumference of the optical probe 52 to a predetermined potential, say, the ground potential. Then, the tip 63 of the probe 52 is brought close to the object to be measured such as an integrated circuit (not shown), whereupon a change occurs in the refractive index of the tip 63 of the electro-optic material 62 in the probe 52. Stated more specifically, the difference between refractive indices for an ordinary ray and an extraordinary ray in a plane perpendicular to the light-traveling direction will change in the optically uniaxial crystal.

The light beam issuing from the light source 53 passes through the condenser lens 60 and is guided through the optical fiber 51 to be directed into the collimator 94 in the optical probe 52. The beam is polarized by the polarizer 54 and a predetermined polarized component having intensity I is launched into the electro-optic material 62 in the optical probe 52 via the beam splitter 56. Each of the reference light and the input light, which are produced by passage through the beam splitter 56, has an intensity of I/2. As already mentioned, the refractive index of the tip 63 of the electro-optic material 62 varies with the voltage on the object being measured, so the input light launched into the electro-optic material 62 will experience a change in the state of its polarization at the tip 63 in accordance with the change in the refractive index of the latter. The input light is then reflected from the reflecting mirror 65 and makes a return trip through the electro-optic material 62, from which it emerges and travels back to the beam splitter 56. If the length of the tip 63 of the electro-optic material 62 is written as l, the state of polarization of input light launched into that material will change in proportion to the difference between refractive indices for an ordinary ray and an extraordinary ray and to the length 2 as well. The output light sent back into the beam splitter 56 is thence directed into the analyzer 57. The intensity of the output light entering the analyzer 57 has been decreased to I/4 as a result of splitting with the beam splitter 56. If the analyzer 57 is designed in such a way as to transmit only a light beam having a polarized component perpendicular to that extracted by the polarizer 54, the intensity of output light that is fed into the analyzer 57 after experiencing a change in the state of its polarization is changed from I/4 to $(I/4)\sin^2[(\pi/2)V/V_0]$ in the analyzer 57 before it is further fed into the photoelectric converter 58. In the formula expressing the intensity of output light emerging from the analyzer 57, V is the voltage developing in the object to be measured, and $V_0$ is a half-wave voltage.

In the comparator circuit 61, the intensity of reference light produced from the photoelectric converter 55, or I/2, is compared with the intensity of output light produced from the other photoelectric converter 58, or $(I/4)\sin^2[(\pi/2)V/V_o]$.

The intensity of output light, or $(I/4)\sin^2[(\pi/2)V/V_0]$, will vary with the change in the refractive index of the tip 63 of the electro-optic material 62 that occurs as a result of the change in voltage. Therefore, this intensity can be used as a basis for detecting the voltage developing in a selected area of the object to be measured, say, an integrated circuit.

As described above, in using the voltage detector 50 shown in FIG. 8, the tip 63 of the optical probe 52 is brought close to the object to be measured and the resulting change in the refractive index of the tip 63 of the electro-optic material 62 is used as a basis for detecting the voltage developing in a selected area of the object of interest. Therefore, the voltage developing in fine-line portions of a small and complicated object such as an integrated circuit which are difficult to be contacted by a probe or which cannot be contacted by the same without affecting the voltage being measured can be effectively detected by the detector 50 without bringing the optical probe 52 into contact with such fine-line portions.

In the voltage detector 50 shown in FIG. 8, the input light travels on the same path as the output light in the electro-optic material 62, so part of the output light passes through the beam splitter 56 toward the collimator 94 and is not effectively used for voltage detection. As a result, the intensity of the output light launched into the analyzer 57 is about one half the intensity of reference light launched into the condenser lens 95 or photoelectric converter 55 and is not high enough to enable precise detection of the voltage developing in a selected area of the object being measured. Furthermore, part of the output light that passes through the beam splitter 56 toward the collimator 94 returns to the light source 53 to potentially instabilize its operation. A further problem with the voltage detector 50 shown in FIG. 8 results from the fact that the length of the tip 63 of the electro-optic material 62 must be held within certain limits in order to isolate the detector from the adverse effects of ambient noise voltage. In other words, if the voltage developing in a selected area of the object to be measured is low, the state of polarization of a light beam will change only slightly and the voltage of interest cannot be detected with high sensitivity.

SUMMARY OF THE INVENTION

An object, therefore, of the present invention is to provide a voltage detector that is capable of precise and sensitive detection of the voltage developing in a selected area of an object to be measured.

The present invention is directed to an improvement of a voltage detector of a type that employs an electro-optic material whose refractive index varies with the voltage developing in a selected area of an object to be measured.

According to one aspect of the present invention, the above-stated object is attained by employing an optical means that allows input light launched into the electro-optic material to travel on a different path than output light emerging from said electro-optic material. The input light is launched into the electro-optic material after being refracted by a predetermined angle with the optical means. The output light radiating from the electro-optic material re-enters the optical means. Since this output light is allowed to travel on a different path than the input light by virtue of the optical means, there is no need to employ a beam splitter for separating the output light from the input light and the former can be picked up without experiencing any substantial change in intensity from that of the incident light.

According to another aspect of the present invention, said optical means is combined with a reflecting means that causes multiple reflections of light within the electro-optic material. Not only is the output light picked up in an intensity substantially equal to that of the input light but also multiple reflections of light are caused within the electro-optic material. Therefore, the optical path traveled by light beams in the electro-optic material is sufficiently extended to cause a great change in the state of polarization of output light on account of the change in the refractive index of said electro-optic material. This enables sensitive detection of a low voltage that develops in a selected area of the object being measured.

Other and further objects, features and advantages of the invention will appear more fully from the following description taken in connection with the accompanying drawings.

DETAILED DESCRIPTION OF THE INVENTION

Various embodiments of the present invention are described hereinafter with reference to the accompanying drawings.

Figure 1:
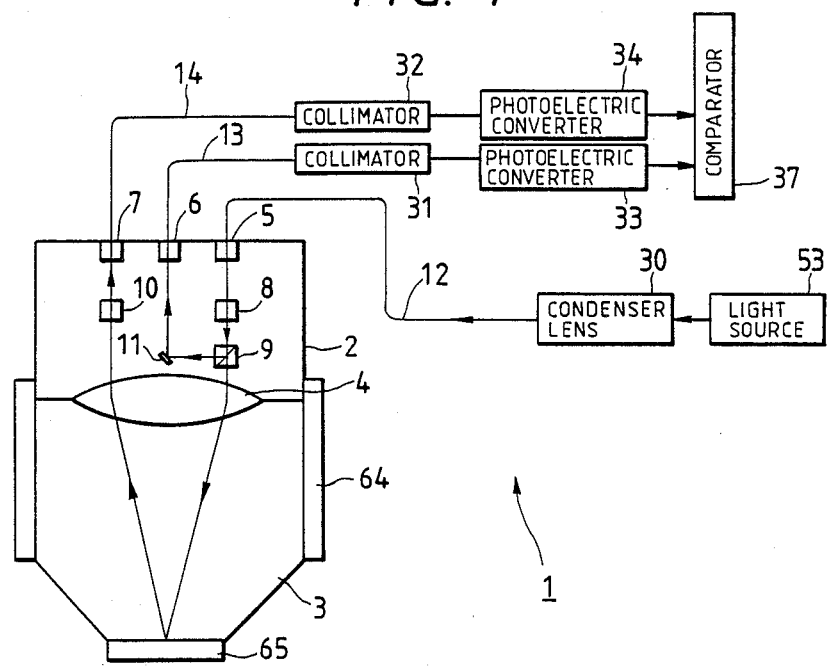
FIG. 1 is a diagram showing the composition of a voltage detector according to one embodiment of the first aspect of the present invention.

FIG. 1 is a diagram showing the composition of a voltage detector according to one embodiment of the first aspect of the present invention.

The voltage detector generally indicated by 1 in FIG. 1 comprises an optical probe 2 accommodating an electro-optic material 3 in which a convex lens 4 as an optical means is partly buried. The optical probe 2 also accommodates the following components: a collimator 5; condenser lenses 6 and 7; a polarizer 8 that selectively extracts a light beam having a predetermined polarized component from the light beam issuing from the collimator 5; a beam splitter 9 that splits the polarized light beam from the polarizer 8 into two components, one of which is directed as input light toward a convex lens 4 and the other is directed as reference light toward a mirror 11 and condenser lens 6; and an analyzer 10 by which a predetermined polarized component is extracted from output light that has been radiated from the convex lens 4 to enter the electro-optic material 3 and has been reflected from a reflecting mirror 65 in the form of a thin metal film or a multilayered dielectric film, and is into a condenser lens 7. The convex lens 4 which is partly buried in the electro-optic material 3 is so designed that rays of light passing through it converge at a point on the reflecting mirror 65.

A light beam issuing from a light source 53 is concentrated by a condenser lens 30 and is launched into the collimator 5 in the optical probe 2 through an optical fiber 12. The condenser lenses 6 and 7 in the optical probe 2 are connected to collimators 31 and 32, respectively, via optical fibers 13 and 14. The reference light and output light collimated by the collimators 31 and 32 are launched into photoelectric converters 33 and 34, respectively. Output electric signals from the photoconverters 33 and 34 are compared in a comparator circuit 37 so as to detect the voltage developing in a selected area of the object to be measured.

Figure 8:
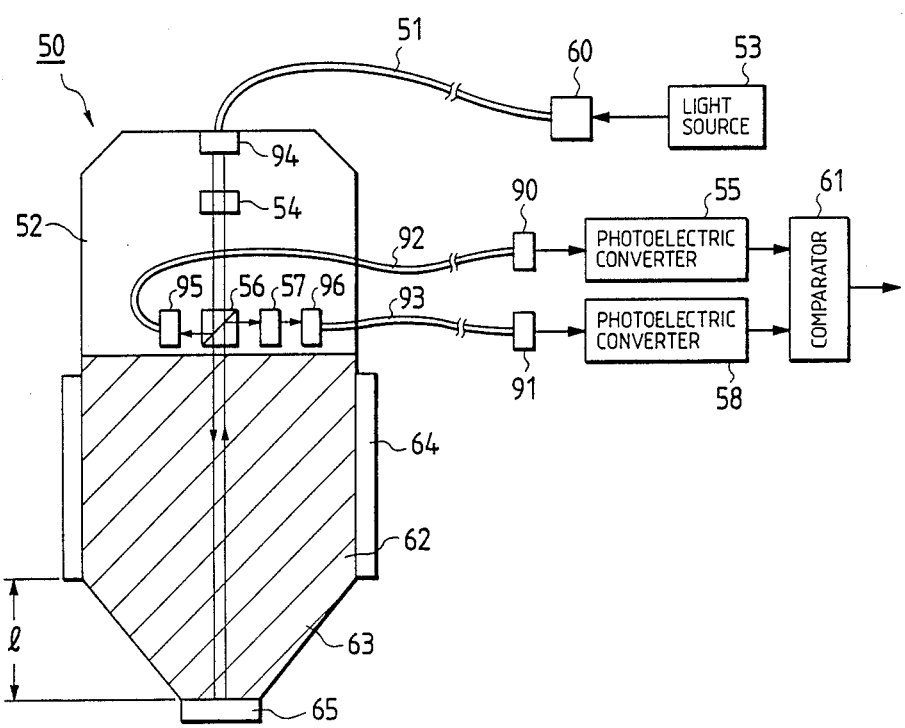
FIG. 8 is a diagram showing the composition of a voltage detector having been proposed in Japanese patent application No. 137317/1987.

In the voltage detector 1 having the composition described above, a light beam emanating from the CW (Continuous-Wave) light source 53, typically in the form of a laser diode, passes through the condenser lens 30, optical fiber 12, collimator 5 and polarizer 8 to enter the beam splitter 9 as a light beam of intensity I having a predetermined polarized component. As with the beam splitter 56 shown in FIG. 8, the light beam entering the beam splitter 9 is split into two components, one of which is guided as reference light toward the mirror 11 and the condenser lens 6, and the other is directed as input light toward the convex lens 4. Each of the resulting reference light and input light has an intensity of I/2.

The reference light from the beam splitter 9 passes through the optical fiber 13 and collimator 31 to be launched into the photoelectric converter 33, whereas the input light from the beam splitter 9 passes through the convex lens 4 having a focal point on the reflecting mirror 65 and thence is launched into the electro-optic material 3 and travels therethrough until it reaches the reflecting mirror 65. The input light is then reflected from the mirror 65 and travels back to the convex lens 4 as output light. As is clear from FIG. 1, the convex lens 4 has such a converging action that the input light travels on a different path than the output light, thereby permitting the output light from the convex lens 4 to be directly launched into the analyzer 10 without passing through any beam splitter. In the absence of any additional beam splitter on the path between the beam splitter 9 and the analyzer 10, the output light entering the analyzer 10 has an intensity of I/2 which is of the same value as the intensity of the reference light.

The output light entering the analyzer 10 has undergone a change in the state of its polarization in the electro-optic material 3 in accordance with the voltage exerted upon said material 3. Therefore, if the analyzer 10 is designed in such a way that the polarized component it extracts is perpendicular to the polarized component extracted by the polarizer 8, the output light picked up by the analyzer 10 should have an intensity of $(I/2)\sin^2[(\pi/2)V/V_0]$. The intensity of the reference light, I/2, and that of the output light, $(I/2)\sin^2[(\pi/2)V/V_0]$, are converted to electric signals in the photoelectric converters 33 and 34, respectively, and compared with each other in the comparator circuit 37 so as to detect the voltage developing in a selected area of the object being measured.

As described above with reference to FIG. 1, the output light from the electro-optic material 3 is not subjected to the splitting action of a beam splitter in the first aspect of the present invention, so all part of the output light is effectively used to ensure that it will have substantially the same intensity as the reference light. In addition, the output light will not return to the light source 53 and stable operation of the latter is guaranteed. Because of these features, the voltage on the object being measured can be detected with high precision in the comparator circuit 37.

Figure 2:
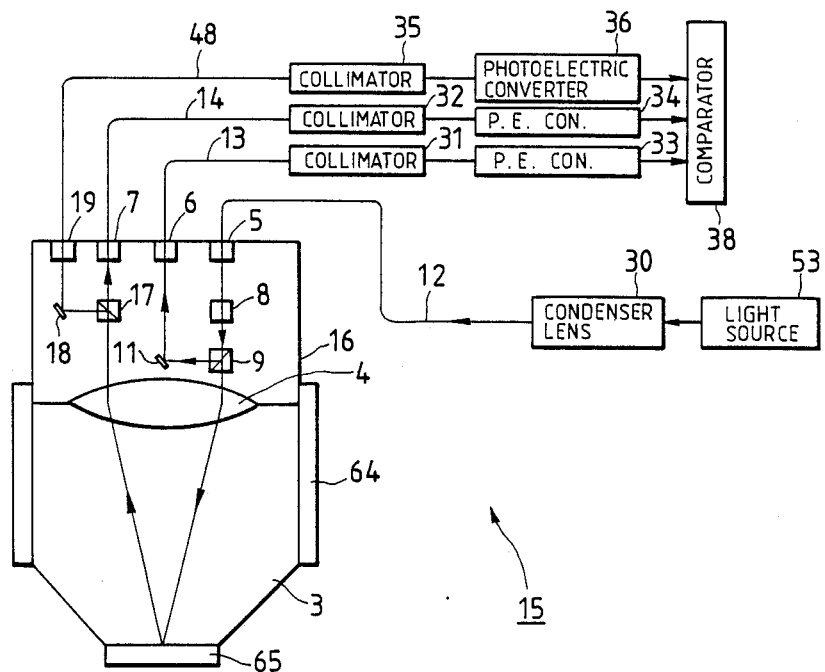
FIG. 2 shows a modification of the voltage detector shown in FIG. 1.

FIG. 2 shows a modification of the voltage detector shown in FIG. 1. the voltage detector generally indicated by 15 in FIG. 2 differs from the detector 1 shown in FIG. 1 in that the optical probe 16 employs a polarizing beam splitter 17 in place of the analyzer 10. This polarizing beam splitter 17 splits the output light from the convex lens 4 into two light beams having polarized components that are perpendicular to each other; one of the light beams is guided through the condenser lens 7, optical fiber 14 and collimator 32 to be launched into the photoelectric converter 34, and the other light beam is guided through a path consisting of the mirror 18, condenser lens 19, optical fiber 48 and collimator 35 and thence is launched into the photoelectric converter 36.

The advantage of using the polarizing beam splitter 17 in place of the analyzer 10 is that even the polarized component that has been blocked by the analyzer 10 can be utilized as effective output light information, thereby enabling the comparator circuit 38 to accomplish more precise detection of the voltage developing in a selected area of the object being measured.

Figure 3A:
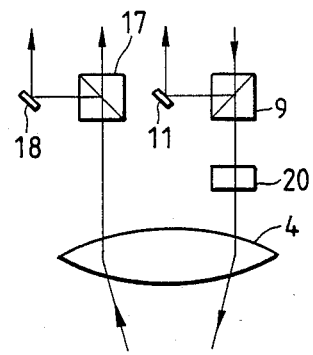
FIG. 3(a) is a diagram showing schematically a part of the composition of a voltage detector equipped with a quarter-wavelength ($\lambda/4$) plate.
Figure 3B:
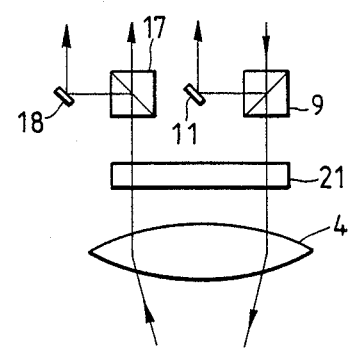
FIG. 3(b) is a diagram showing schematically a part of the composition of a voltage detector equipped with a $\lambda/8$ plate.

The voltage detector 15 shown in FIG. 2 may be modified as illustrated in FIG. 3(a) by disposing a quarter-wavelength ($\lambda/4$) plate 20 between the beam splitter 9 and the convex lens 4, or as depicted in FIG. 3(b) by disposing a $\lambda/8$ plate 21 between each of the beam splitters 9 and 17 and the convex lens 4. If desired, the $\lambda/4$ plate 20 may be disposed between the convex lens 4 and the polarizing beam splitter 17 rather than the beam splitter 9.

If the $\lambda/4$ plate 20 is disposed as shown in FIG. 3(a), the linearly polarized input light from the beam splitter 9 is converted to circularly polarized light by means of the $\lambda/4$ plate 20 and thence is launched into the electrooptic material 3 past the convex lens 4. In the absence of any voltage applied to the electro-optic material 3, the input light remains circularly polarized as it makes a round trip through the material 3 and thereafter emerges as output light which is launched into the polarizing beam splitter 17. If the λ/8 plate 21 is disposed as shown in FIG. 3(b), the linearly polarized input light issuing from the beam splitter 9 passes through the plate 21 to be launched into the electro-optic material 3 through the convex lens 4, and after making a round trip through the material 3, the light emerges as output light which passes through the convex lens 4 and the plate 21 to be launched into the polarizing beam splitter 17. In the absence of any voltage applied to the electro-optic material 3, the output light which is about to be launched into the polarizing beam splitter 17 is in a circularly polarized state. Therefore, the λ/8 plate 21 inserted into the optical paths of input and output light performs the same function as the λ/4 plate 20 shown in FIG. 3(a).

As described above, the embodiments shown in FIGS. 3(a) and 3(b) are so designed that circularly polarized output light is launched into the polarizing beam splitter 17 when no voltage is applied to the electro-optic material 3. In the absence of any voltage applied to the electro-optic material 3, the two split light beams issuing from the polarizing beam splitter 17 are equal in intensity and the output electric signal produced from the photoelectric converter 34 becomes equal to that produced from the photoelectric converter 36. As a result, the difference between the electric signals from the two photoelectric converters 34 and 36 as compared in the comparator circuit 38 becomes zero, which is equivalent to the detection of the state in which no voltage is being applied to the electro-optic material 31. In other words, the need to effect zero adjustment on the comparator circuit 38 is eliminated. The additional advantage of taking the difference between the signals from the two photoelectric converters 34 and 36 is that detection sensitivity can be doubled to improve the precision of mathematical operations performed by the comparator circuit 38.

Figure 4:
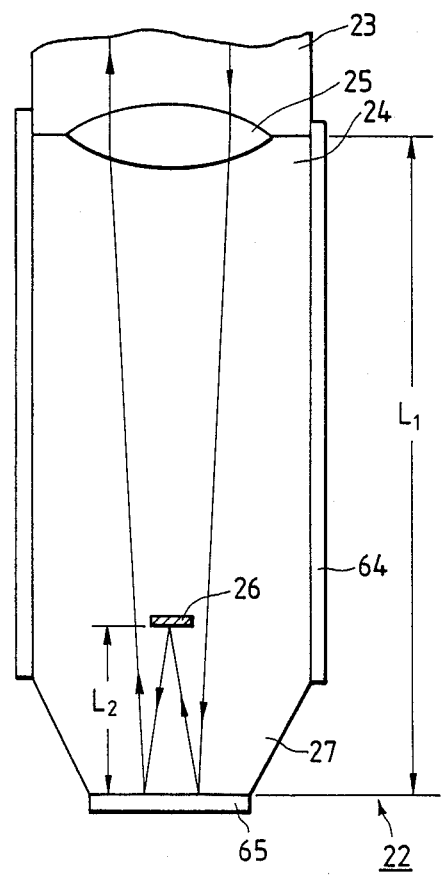
FIG. 4 is a diagram showing a part of the composition of a voltage detector according to one embodiment of the second aspect of the present invention.

FIG. 4 is a diagram showing part of the composition of a voltage detector according to an embodiment of the second aspect of the present invention. The voltage detector generally indicated by 22 in FIG. 4 comprises an optical probe 23 packed with an electro-optic material 24 that has a convex lens 25 partly buried in it. the center of the convex lens 25 is spaced from the reflecting mirror 65 by a distance $L_1$. The electro-optic material 24 contains a mirror 26 that is spaced from the reflecting mirror 65 by a distance $L_2$. The convex lens 25 differs from the convex lens 4 shown in FIG. 1 in that it has a focal length of $(L_1+L_2)$, namely, rays of light emanating from this lens converge at a point on the mirror 26.

In the voltage detector 22 having the composition described above, input light launched into the convex lens 25 travels through the electro-optic material 24 until it reaches the reflecting mirror 65, from which it is reflected and projected onto the mirror 26 which again reflects the light. The reflected light makes another travel to the reflecting mirror 65, from which it is reflected and travels back through the electro-optic material 24 as output light toward the convex lens 25. As described above, the input light launched into the electro-optic material 24 travels through its tip portion 27 (the area effectively supplied with a voltage) over an optical path twice as long as that traveled in the embodiment shown in FIG. 1, and this introduces twice as great change in the state of polarization of the light beam passing through the electro-optic material 24.

As a result, the voltage developing in a selected area of the object to be measured can be detected with about twice the sensitivity that can be attained by the system shown in FIG. 1, and even a low voltage that develops in a selected area of the object of interest can be detected with higher sensitivity which is at least twice the value attained by the previous embodiment.

In the embodiment shown in FIG. 4, input light is reflected only once by the mirror 26. If the input light is reflected n times by the mirror 26, a sensitivity about (n+1) times as high as that attained by the system shown in FIG. 1 can be obtained.

Figure 5:
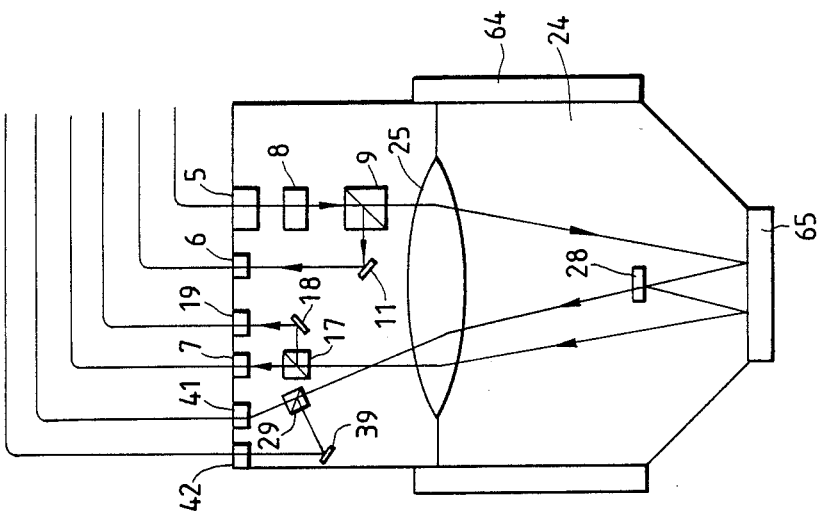
FIG. 5 is a diagram showing a modification of the voltage detector shown in FIG. 4.

FIG. 5 shows a modification of the voltage detector shown in FIG. 4. In this modified version, a beam splitter 28 is used in place of the mirror 26 and part of the light beam reflected from the reflecting mirror 65 is transmitted through this beam splitter 28, and the transmitted light is split by a beam splitter 29 into two components, one being reflected from a mirror 39 and passed through a condenser lens 42 to be launched into an associated photoelectric converter (not shown) and the other being passed through a condenser lens 41 to be launched into an associated photoelectric converter (not shown). The electric signals from the two photoelectric converters are supplied to the comparator circuit 38. Stated more specifically, the comparator circuit 38 is supplied not only with the output electric signals from the photoelectric converters based on the change in the state of polarization of the transmitted light into the beam splitter 29 but also with the output electric signals from the photoelectric converters 34 and 36 based on the polarized component of output light into the beam splitter 17 that has undergone twice as great change in the state of polarization as the polarization of the transmitted light into the beam splitter 29. In this way, the comparator circuit 38 is supplied with an increased amount of the information necessary for detecting the voltage developing in a selected area of the object being measured and, as a result, the precision of voltage detection, namely, the precision of comparison effected in the comparator circuit 38 can be improved.

Figure 6:
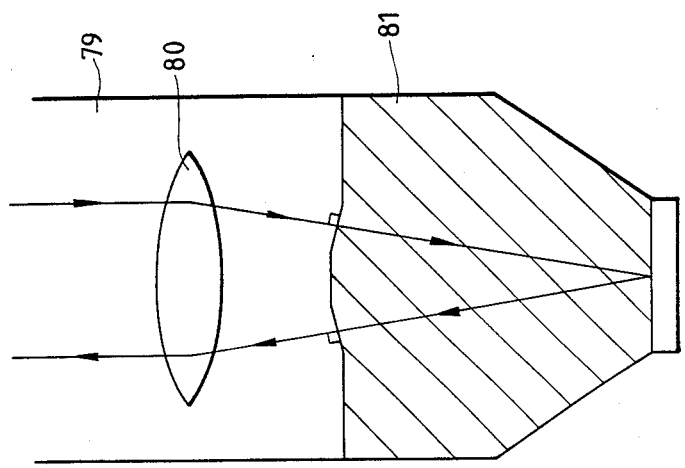
FIG. 6 is a diagram showing a modified optical probe having a convex lens positioned above the electro-optic material.

In the optical probes 2, 16 and 23 used in the embodiments shown in FIGS. 1 to 5, the convex lenses 4 and 25 are partly buried in the electro-optic materials 3 and 24, respectively. An alternative to this arrangement is shown in FIG. 6, in which a convex lens 80 is positioned in an optical probe 79 above an electro-optic material 81, the upper end of which is worked in such a way that input light from the convex lens 80 will be launched vertically into the electro-optic material 81 while output light will radiate also vertically from said material.

Figure 7:
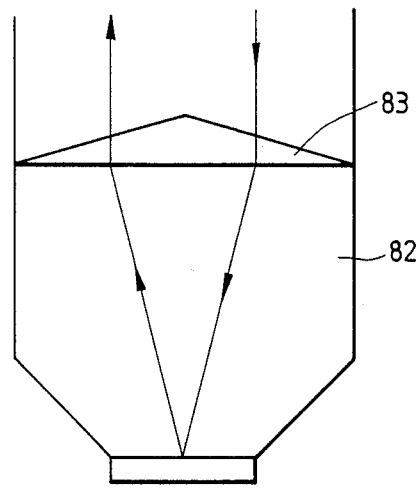
FIG. 7 is a diagram showing another modified optical probe in which an optical means in the form of a triangular prism is positioned above the electro-optic material.

In the previous embodiments, convex lenses 4, 25 and 80 are used as optical means for allowing input light to travel on a different path than output light. If desired, these convex lenses may be replaced by a triangular prism 83 which, as shown in FIG. 7, is positioned above an electro-optic material 82.

The foregoing embodiments, for example, the one shown in FIG. 1 assumes that the polarized component extracted with the analyzer 10 is perpendicular to that extracted with the polarizer 8. It should, however, be noted that these two polarized components may be parallel to each other and in this case the output light picked up by the analyzer 10 will have an intensity proportional to $\cos^2[(\lambda/2)V/V_0]$. If desired, the two polarized components may have such a spatial relationship that they are inclined with respect to each other at a desired angle.

In order to accomplish more precise detection of rapid changes in voltage with a high time resolution, a quick-response detector such as a streak camera may be used as a detector. In this case, the reference light is not always used.

Although the foregoing embodiments assume the case where the CW light source is used as the light source 53, rapid changes in voltage in the object can be detected by utilizing a light source such as a laser diode which emits light pulses with very short pulse width as the light source 53 and performing a sampling measurement.

The advantages of the voltage detector of the present invention can be summarized as follows: According to its first aspect, the optical means is provided in such a way that the input light launched into the electro-optic material will travel on the different path than the output light emerging from the electro-optic material, and this enables the output light to be picked up in substantially the same intensity as the input light, thereby allowing all part of the output light to be fully utilized to assure precise detection of the voltage developing in a selected area of the object to be measured; in addition, no part of the output light will return to the light source, so stable operation of the latter is guaranteed; according to the second aspect of the present invention, not only are the input and output light allowed to travel on different paths but they are also reflected more than once in the elecro-optic material so as to increase the amount of change that occurs in the state of polarization of the output light, and this permits the voltage developing in a selected area of the object of interest to be detected with high sensitivity and precision even if it is at low level.

What is claimed is:

1. A voltage detector for detecting a voltage developing in a selected area of an object to be measured, comprising:
    a light source for emitting a light beam;
    a voltage-sensing part including first reflection means for reflecting an input light beam, and an electro-optic material whose refractive index changes according to said voltage developing in said selected area of said object;
    splitting and extracting means for extracting a light beam with a first predetermined polarized component from a light beam introduced from said light source which is launched into said electro-optic material as said input light beam, and extracting an output light beam with a second predetermined polarized component from an output light beam emerging from said electro-optic material after reflecting from said first reflection means;
    an optical means disposed between said voltage sensing part and said splitting and extracting means, for making light paths of said input light and said output light different from each other; and
    detection means for determining said voltage developing in said selected area of said object on the basis of intensity of said output light beam with said second predetermined polarized component.

2. A voltage detector as claimed in claim 1, wherein said splitting and extracting means further splits said light beam with said first predetermined polarized component into a reference light beam and said input light beam which is launched into said second electro-optic material; and
    said detection means determines said voltage on the basis of intensity of said reference light beam and intensity of said output light beam with said second predetermined polarized component.

3. A voltage detector as claimed in claim 1, wherein said optical means is a convex lens.

4. A voltage detector as claimed in claim 3, wherein said convex lens is partly buried in said electro-optic material.

5. A voltage detector as claimed in claim 1, wherein said optical means is a triangular prism.

6. A voltage detector as claimed in claim 2, wherein said splitting and extracting means includes:
    a first beam splitter for splitting said light beam with said first predetermined polarized component into said reference light beam and said input light beam which is launched into said electro-optic material through said optical means; and
    a polarizing beam splitter for splitting said output light beam from said optical means into said output light beam with said second predetermined polarized component and an output light beam with a third predetermined polarized component which is perpendicular to said second predetermined polarized component; and
    said detection means determines said voltage by further utilizing said output light beam with said third predetermined polarized component.

7. A voltage detector as claimed in claim 6, further comprising a $\lambda/4$ plate disposed between said first beam splitter and said optical means, for changing polarization of said input light beam from linear polarization to circular polarization.

8. A voltage detector as claimed in claim 6, further comprising a $\lambda/4$ plate disposed between said optical means and said polarizing beam splitter, for changing polarization of said output light beam from linear polarization to circular polarization.

9. A voltage detector as claimed in claim 6, further comprising $\lambda/8$ plates between said first beam splitter and said optical means and between said optical means and said polarizing beam splitter.

10. A voltage detector as claimed in claim 1, further comprising second reflection means disposed between said first reflection means and said optical means in said electro-optic material, for reflecting a light beam plural times between said first and second reflection means.

11. A voltage detector as claimed in claim 10, wherein said second reflection means is a mirror.

12. A voltage detector as claimed in claim 10, wherein
    said second reflection means is a second beam splitter which splits a light beam reflected from said first reflection means into a light beam going toward said first reflection means and a light beam going out of said electro-optic material toward said splitting and extracting means; and
    said detection means determines said voltage by further utilizing said light beam going out of said second beam splitter after being split.

* * * * *